United States Patent [19]
Biebl

[11] Patent Number: 5,753,134
[45] Date of Patent: May 19, 1998

[54] METHOD FOR PRODUCING A LAYER WITH REDUCED MECHANICAL STRESSES

[75] Inventor: Markus Biebl, Augsburg, Germany

[73] Assignee: Siemens Aktiengesellschaft, Munich, Germany

[21] Appl. No.: 347,118

[22] Filed: Nov. 23, 1994

[30] Foreign Application Priority Data

Jan. 4, 1994 [DE] Germany .................. 44 00 119.3

[51] Int. Cl.$^6$ ................................................ H01L 21/02
[52] U.S. Cl. ............... 216/83; 156/654.1; 156/657.1; 216/96; 216/99; 427/402
[58] Field of Search ................ 156/643.1, 646.1, 156/654.1–657.1, 662.1; 216/58, 65–67, 96, 99, 108, 109, 83; 427/402

[56] References Cited

U.S. PATENT DOCUMENTS

| | | | |
|---|---|---|---|
| 4,339,303 | 7/1982 | Frisch et al. | 216/67 |
| 4,980,018 | 12/1990 | Mu et al. | 156/643.1 |
| 4,980,020 | 12/1990 | Douglas | 156/643.1 |
| 4,998,267 | 3/1991 | Lee et al. | |
| 5,059,556 | 10/1991 | Wilcoxen | |
| 5,262,000 | 11/1993 | Welbourn et al. | 156/643 |

FOREIGN PATENT DOCUMENTS

| | | |
|---|---|---|
| 0 497 499 A1 | 8/1992 | European Pat. Off. |
| 0 574 697 A1 | 12/1993 | European Pat. Off. |

OTHER PUBLICATIONS

Patent Abstracts of Japan—JP 63136521—vol. 12, No. 395 (E–671).
Patent Abstracts of Japan—JP-5102326—vol. 17, No. 453 (E–1417).

J. Electrochem. Soc., vol. 139, No. 12, Dec. 1992, Bhatnagar et al, "Low Stress Oxide–Polysilicon Sandwiched Microbridges", pp. 3623–3626.

Mater. Res. Soc., 1986 month unavailable, Ahn et al, "Properties of Tungsten Films Prepared by Magnetron Sputtering" (Abstract).

Proceedings of the 1989 International Symposium on Micro–Process. Conference, 1989 month unavailable, Itoh et al "Fabrication of an Ultra Low Stress Tungsten Absorber for X-Ray Masks".

Extended abstracts of the 19th Conference on Solid State Devices and Materials, 1987 month unavailable, Yamamoto, "Degradation of MOS Characteristics Caused by Internal Stresses in Gate Electrodes".

Conference Record of the 1988 IEEE International Symposium on Electrical Insulation, Jun., 1988, J. Kanicki et al, "Intrinsic Stress in Silicon Nitride and Silicon Dioxide Films Prepared by Various Deposition Techniques".

Elsevier Sequoia, 1992 month unavailable, Ristic et al, "Properties of Polysilicon Films Annealed by a Rapid Thermal Annealing Process", pp. 106–110.

Elsevier Sequoia, 1989 month unavailable, Guckel et al, "Fabrication of Micromechanical Devices from Polysilicon Films with Smooth Surfaces", pp. 117–122.

*Primary Examiner*—T. Tung
*Attorney, Agent, or Firm*—Hill & Simpson

[57] ABSTRACT

For producing a layer having reduced mechanical stresses, the layer is composed of at least two sub-layers that are matched to one another such that stress gradients in the two layers substantially compensate. The method is particularly employable in the manufacture of structures in surface micromechanics.

3 Claims, 2 Drawing Sheets

5,753,134

METHOD FOR PRODUCING A LAYER WITH REDUCED MECHANICAL STRESSES

BACKGROUND OF THE INVENTION

The development of mechanical stresses within layers often occurs in the manufacture of layers in semiconductor technology. These mechanical stresses are dependent on selected deposition conditions. These mechanical stresses are often referred to as stress. A distinction is made between absolute stress, which indicates the integral mechanical stressing of a layer, and stress gradient, which describes mechanical stresses within the layer and leads to a bending moment.

Such mechanical stresses are particularly observed in the production of layers of polysilicon, $SiO_2$, $Si_3N_4$ and metal.

Mechanical stresses influence diffusion processes within a layer. Given the employment of doped layers of, for example, polysilicon as a diffusion source, mechanical stresses of the polysilicon layer therefore have a disturbing effect.

Self-supporting structures are produced in micromechanics by structuring and partial under-etching of layers, these self-supporting structures being connected to a substrate via supporting points. Micromechanics on the basis of silicon process technology has increasing significance in sensor engineering since micromechanical systems therein can be manufactured by integration with an evaluation electronics on a substrate. A mechanical stress in the layer from which the structures are manufactured is likewise disturbing in the manufacture of self-supporting structures. The absolute stress in these systems can in fact be compensated by a suitable, stress-relaxing suspension of the structures. The stress gradient, however, leads to a bending of the self-supporting structure that makes it unusable.

For reducing mechanical stresses in a layer, it is known (see, for example, H. Guckel et al., Sensors and Actuators, 20 (1989), 117–122 "Fabrication of Micromechanical Devices from Polysilicon Films with Smooth Surfaces") to dope the layer and to subsequently temper it. For effectively eliminating the stresses, however, temperatures are required that proceed substantially beyond the temperature stresses that can be accepted for modern electronic processes. This method is therefore unsuitable for utilization in microelectronics.

SUMMARY OF THE INVENTION

It is an object of the invention to specify a method for producing a layer with reduced mechanical stresses wherein unacceptable temperature stresses are avoided.

In the method of the invention, the layer is composed of at least one first sub-layer and one second sub-layer. The first sub-layer and the second sub-layer are matched to one another such that the stress gradients in the two layers substantially compensate. The bending moments of the sub-layers therefore cancel. A bending of a self-supporting structure that is formed from this layer later is thus avoided. This occurs, for example, in that the first sub-layer is deposited with a positive stress gradient and the second sub-layer is deposited with a corresponding negative stress gradient. It is critical for the method of the invention that the force moment in the middle plane of the manufactured layer resulting due to corresponding stress gradients in the two sub-layers becomes zero.

The first sub-layer is produced, for example, of $Si_3N_4$ with a positive stress gradient, and the second sub-layer is produced of $SiO_2$ with a negative stress gradient. The first sub-layer can also be formed by deposition of, for example, tungsten, that is deposited with a tensile stress or, respectively, a compressive strain or suitable stress gradient, and the second sub-layer can be formed by deposition of tungsten that is deposited with a compressive strain or, respectively, a tensile stress or suitable stress gradient.

It is advantageous for producing a layer of polysilicon to form the first sublayer of polysilicon and the second sub-layer of amorphous silicon. It is advantageous in this case to produce an auxiliary layer of, for example, $SiO_2$ between the first sub-layer and the second sub-layer in order to avoid an epitaxial growth of the amorphous layer. Polycrystalline silicon arises from the second sub-layer of amorphous silicon by subsequent tempering of the two sub-layers. The temperature stresses required for this purpose are compatible with microelectronic manufacturing processes.

It particularly lies within the scope of the invention to compose the layer of more than two sub-layers. In this case, an averaging of the gradient of the mechanical stresses arises. According to the invention, the sub-layers are matched to one another such that the resultant force moment in the middle plane of the manufactured layer is zero.

A layer produced according to the method of the invention is particularly suitable as a diffusion source. Furthermore, it is suitable as a starting point for the manufacture of a micromechanical system.

The invention shall be set forth in greater detail below with reference to the figures and to the exemplary embodiments.

DESCRIPTION OF THE PREFERRED EMBODIMENTS

Figure 1:
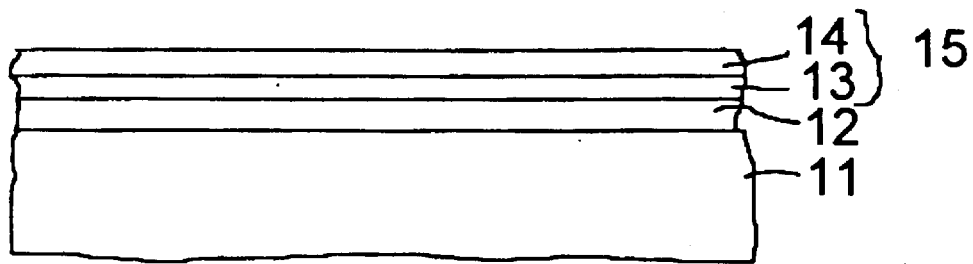
FIG. 1 shows a substrate having a layer composed of two sub-layers.

A sacrificial layer 12 is applied onto a substrate 11. The substrate 11, for example, is a silicon wafer or a SOI substrate. The sacrificial layer, for example, is composed of $SiO_2$ and is deposited in a thickness of, for example, 1 μm (see FIG. 1).

A first sub-layer 13 is applied onto the surface of the sacrificial layer 12. A second sub-layer 14 is applied onto the first sub-layer 13. The first sub-layer 13 and the second sub-layer 14 together form the layer 15.

The first sub-layer 13 is deposited, for example, as tungsten. The deposition thereof is managed such that the first sub-layer 13 is under a positive stress gradient. The second sub-layer 14, for example, is likewise formed of tungsten. The deposition thereof is managed such that the second sub-layer is under a negative stress gradient. The mechanical stress gradient in the first sub-layer 13 and in the second sub-layer 14 compensate, so that the force moment in the middle plane of the layer 15 is zero.

Figure 2:
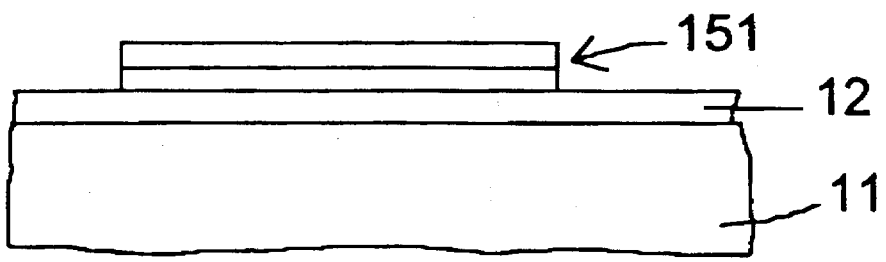
FIGS. 2 and 3 show the manufacture of a micromechanical structure from the layer composed of two sub-layers.

The layer 15 is suitable for manufacturing a self-supporting structure 151 for a micromechanical system. For that purpose, the layer 15 is first structured so that the shape of the self-supporting structure 151 is defined in the plane parallel to the surface of the substrate 11 (see FIG. 2). For that purpose, a mask and an etching process that is selective relative to the sacrificial layer 12 are employed.

Figure 3:
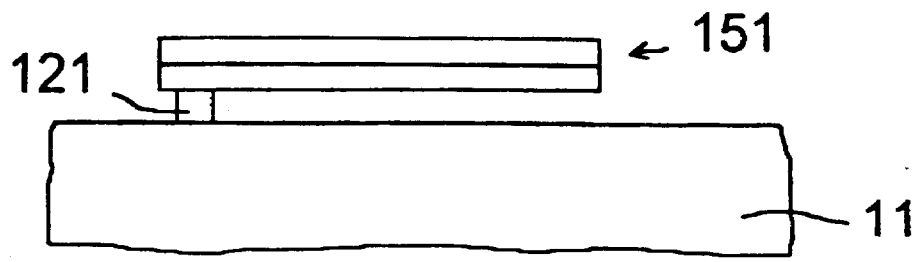
Figure 4:
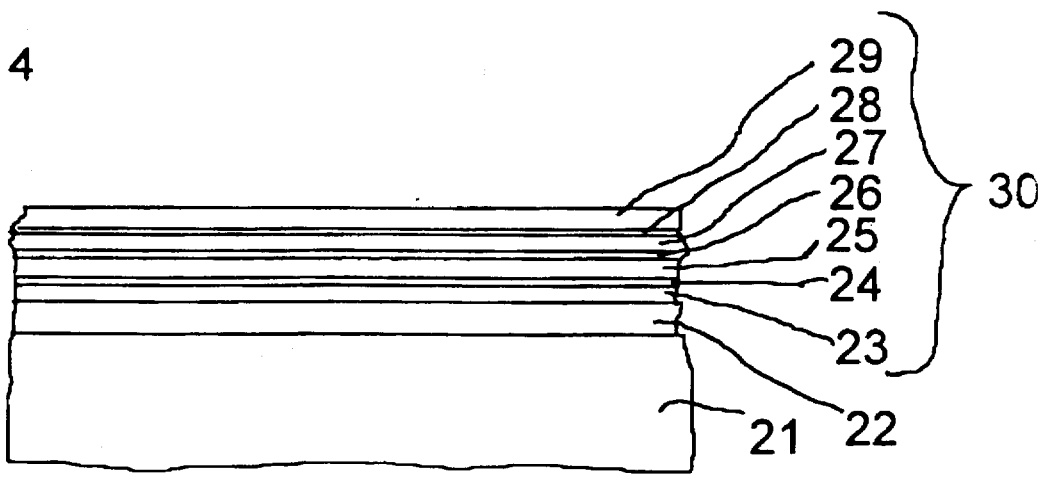
FIG. 4 shows a layer composed of four sub-layers, whereby an auxiliary layer is arranged between two respective, neighboring sub-layers.

Subsequently, the sacrificial layer 12 is etched selectively relative to the self-supporting structure 151 and relative to the substrate 11, for example with a buffered hydrofluoric acid. The sacrificial layer 12 is also partially removed under the self-supporting structure 151, so that the latter is firmly joined to the substrate 11 only via a supporting portion 121 (see FIG. 3). An sacrifical layer 22 is applied onto a substrate 21 (see FIG. 4). The substrate 21, for example, is a silicon wafer or a SOI substrate. The sacrificial layer 22 is, for example, formed of $SiO_2$ and is applied in a thickness of, for example, 1 μm.

A first sub-layer 23 is applied onto the sacrificial layer 22. An auxiliary layer 24 is applied onto the first sub-layer 23. A second sub-layer 25 is applied onto the auxiliary layer 24. An auxiliary layer 26 is applied onto the second sub-layer 25. A third sub-layer 27 is applied onto the auxiliary layer 26. An auxiliary layer 28 is applied onto the third sub-layer 27. A fourth sub-layer 29 is applied onto the auxiliary layer 28. The first sub-layer 23, the auxiliary layer 24, the second sub-layer 25, the auxiliary layer 26, the third sub-layer 27, the auxiliary layer 28 and the fourth sub-layer 29 together form a layer 30 having reduced mechanical stresses.

The first sub-layer 23 of, for example, polycrystalline silicon, is applied onto the sacrificial layer 22. Subsequently, the auxiliary layer 24 of $SiO_2$ is produced with a thickness of, for example, 0.1–3 nm. The auxiliary layer 24 is produced, for example, by a corresponding waiting time at atmosphere, an oxidizing cleaning, or by oxidation at an elevated temperature. The second sub-layer 25 is likewise produced from polycrystalline silicon. Since the auxiliary layer 24 offers conditions like the sacrificial layer 22 for the nucleation and the growth of the second sub-layer 25, the second sub-layer 25 grows analogous to the first sub-layer 23. The stress gradient in the second sub-layer 24 therefore corresponds to that in the first sub-layer 23.

The auxiliary layer 26 is likewise produced of $SiO_2$ with a thickness of approximately 0.1–3 nm. The third sub-layer 27, likewise formed of polycrystalline silicon, is deposited thereon. The growth of the third sub-layer 27 corresponds to that of the second sub-layer 25 as well as to that of the first sub-layer 23. The auxiliary layer 28 of $SiO_2$ is applied with a thickness between 0.1 and 3 nm onto the third sub-layer 27. The fourth sub-layer 29, likewise of polycrystaline silicon, is grown onto the auxiliary layer 28.

Since the first sub-layer 23, the second sub-layer 25, the third sub-layer 27 and the fourth sub-layer 29 have been grown under comparable conditions, the stress gradients are the same in all sub-layers.

When growing a layer of polysilicon, a growth of many small crystallites that compete for further growth during the course of the layer deposition arises in the lower part. In a polycrystalline layer that comprises a thickness of, for example, 200–2000 nm, this leads to a pronounced compressive strain in the approximately first 100 nm. The compressive strain decreases toward the top.

This stress gradient in each of the sub-layers 23, 25, 27, 29 is compensated in the method of the invention, since the sub-layers deposited over one another lead to an averaging of the stress gradient. The mechanical stress gradient of the individual sub-layers are compensated all the better in the layer 30 the more sub-layers of polysilicon are deposited under corresponding conditions.

In another exemplary embodiment of the invention, the first sub-layer 23 and the third sub-layer 27 are deposited of polycrystalline silicon. The second sub-layer 25 and the fourth sub-layer 29, by contrast, are deposited of amorphous silicon. The auxiliary layers 24, 26, 28 are again deposited of $SiO_2$ with a thickness between 0.1 and 3 nm. A compressive strain results in the layer, given the deposition of polycrystalline silicon. Given the deposition of amorphous silicon, by contrast, a tensile stress results in the arising layer. The auxiliary layers 24, 26, 28 assure that no epitaxial growth occurs when growing silicon. Due to a tempering of the layer 30, the second sub-layer 25 and the fourth sub-layer 29 of amorphous silicon are converted into polycrystalline silicon.

Dopant is introduced into the sub-layers 23, 25, 27, 29 for setting the electrical resistance of the layer 30. This can occur both after the deposition of the corresponding sub-layers as well as after the overall layer 30 has been finished. So that the layer 30 comprises a sheet resistivity corresponding to a single polysilicon layer having the same thickness, it is advantageous to break up the auxiliary layers 24, 26, 28 of $SiO_2$ with a tempering. For example, such a tempering is a ROA tempering at approximately 1000° C. Such a tempering is process-compatible.

Figure 5:
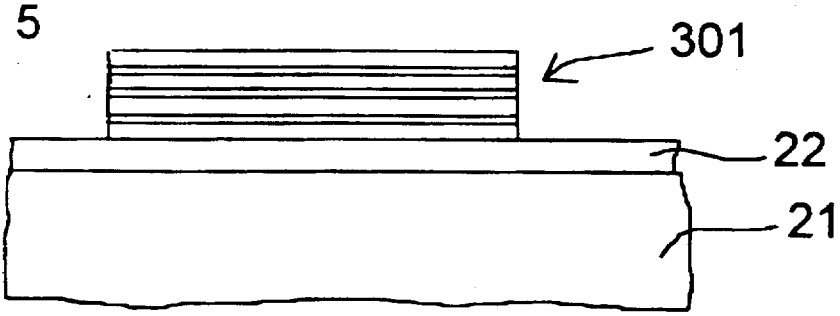
FIGS. 5 and 6 show the manufacture of a micromechanical structure from the layer composed of four sub-layers.
Figure 6:
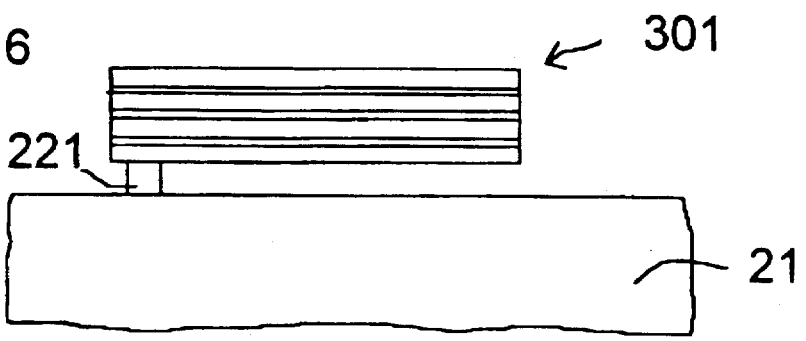

The layer 30 is suitable for manufacturing a self-supporting structure in a micromechanical system. For that purpose, the layer 30 is structured so that a self-supporting structure 301 arises. This occurs with the assistance of a mask technique and with the assistance of an etching that is selective relative to the sacrificial layer 22 (see FIG. 5). subsequently, the sacrificial layer 22 is partially removed in an isotropic etching process, for example, with buffered hydrofluoric acid, this occurring selectively relative to the self-supporting structure 301 and relative to the substrate 21, so that only a supporting portion 221 of the sacrificial layer 22 remains via which the self-supporting structure 301 is connected to the substrate 21 (see FIG. 6). Components for a drive electronics of the micromechanical system can be realized in the substrate 21 before or after the manufacture of the self-supporting structure 301.

The first sub-layer 23, the second sub-layer 25, the third sub-layer 27 and the fourth sub-layer 29 are preferably produced with a thickness between 50 nm and 1 μm.

Although various minor changes and modifications might be proposed by those skilled in the art, it will be understood that I wish to include within the scope of the patent warranted hereon, all such changes and modifications as reasonably come within my contribution to the art.

I claim as my invention:

1. A method for producing a layer with reduced mechanical stresses, comprising the steps of:
    providing a substrate;
    applying a sacrificial layer onto the substrate, said sacrificial layer being etchable selectably relative to the substrate and relative to the reduced mechanical stress layer to be produced;
    producing said reduced mechanical stress layer on the surface of the sacrificial layer by applying in sequence a first sub-layer on the sacrificial layer, a first auxiliary layer, a second sub-layer, a second auxiliary layer, a third sub-layer, a third auxiliary layer, and a fourth sub-layer, the first, second, and third auxiliary layers being thinner than the first, second, third, and fourth sub-layers, the first, second, third and fourth sub-layers comprising polycrystalline silicon, and the first, second, and third auxiliary layers comprising $SiO_2$;

growing the first, second, third, and fourth sub-layers under substantially same conditions such that stress gradients are substantially the same in all four sub-layers since each sub-layer is grown on a same kind of auxiliary layer providing like nucleation and growth conditions so that the combination of the four sub-layers with the first, second, and third auxiliary layers results in the stress gradients in the sub-layers being compensated;

structuring the reduced mechanical stress layer; and partially removing the sacrificial layer by selective etching so that the structured layer is joined to the substrate via at least one supporting portion.

2. A method for producing a layer with reduced mechanical stresses, comprising the steps of:

providing a substrate;

applying a sacrificial layer onto the substrate, said sacrificial layer being etchable selectably relative to the substrate and relative to the reduced mechanical stress layer to be produced;

producing the reduced mechanical stress layer on the surface of the sacrificial layer by applying a first sub-layer directly onto the surface of the sacrificial layer and then applying a second sub-layer onto the first sub-layer;

depositing the first sub-layer as $Si_3N_4$ in a method which creates a positive stress gradient in the first sub-layer and depositing the second sub-layer as $SiO_2$ with a method so that the second sub-layer has a negative stress gradient which is opposite the positive stress gradient, and controlling the creation of the first and second sub-layers such that the positive stress gradient substantially equals and opposes the negative stress gradient so that the mechanical stress gradients in the first sub-layer and in the second sub-layer cancel each other so that a force moment in a middle plane of the reduced mechanical stress layer is substantially zero;

structuring the reduced mechanical stress layer; and partially removing the sacrificial layer by selective etching so that the structured layer is joined to the substrate via at least one supporting portion.

3. A method for producing a layer with reduced mechanical stresses, comprising the steps of:

providing a substrate;

applying a sacrificial layer onto the substrate, said sacrificial layer being etchable selectably relative to the substrate and relative to the reduced mechanical stress layer to be produced;

producing the reduced mechanical stress layer by first applying in sequence a first sub-layer on the sacrificial layer, a first auxiliary layer, a second sub-layer, a second auxiliary layer, a third sub-layer, a third auxiliary layer, and a fourth sub-layer, the first through third auxiliary layers being thinner than the first through fourth sub-layers;

when forming the first sub-layer and the third sub-layer, depositing them of polycrystalline silicon, when depositing the second sub-layer and the fourth sub-layer depositing them of amorphous silicon, and forming the auxiliary layers of $SiO_2$;

providing a compressive strain in the first and third sub-layers deposited of polycrystalline silicon, and a tensile stress in the second and fourth sub-layers deposited of amorphous silicon;

tempering the overall reduced mechanical stress layer so that the second and fourth sub-layers of amorphous silicon are converted into polycrystalline silicon;

structuring the reduced mechanical stress layer; and partially removing the sacrificial layer by selective etching so that the structure layer is joined to the substrate via at least one supporting portion.

* * * * *